United States Patent
Kim

(10) Patent No.: US 8,384,094 B2
(45) Date of Patent: Feb. 26, 2013

(54) LIGHT EMITTING DEVICE, METHOD OF MANUFACTURING THE SAME, LIGHT EMITTING DEVICE PACKAGE AND LIGHTING SYSTEM

(75) Inventor: Sun Kyung Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 199 days.

(21) Appl. No.: 12/954,153

(22) Filed: Nov. 24, 2010

(65) Prior Publication Data

US 2011/0198642 A1  Aug. 18, 2011

(30) Foreign Application Priority Data

Feb. 18, 2010 (KR) .................. 10-2010-0014440

(51) Int. Cl.
*H01L 33/00* (2010.01)
(52) U.S. Cl. .............. 257/82; 438/28; 257/E33.054
(58) Field of Classification Search .............. 257/13, 257/82, 98, 432, E25.032, E33.054; 438/28
See application file for complete search history.

(56) References Cited

U.S. PATENT DOCUMENTS

| | | | |
|---|---|---|---|
| 7,808,011 B2 | 10/2010 | Kim et al. | |
| 7,965,035 B2 * | 6/2011 | Yamauchi | 313/506 |
| 2005/0087884 A1 | 4/2005 | Stokes et al. | |
| 2005/0151145 A1 | 7/2005 | Lin et al. | |
| 2008/0054283 A1 | 3/2008 | Min et al. | |
| 2008/0279229 A1 | 11/2008 | Suzuki et al. | |
| 2009/0128004 A1 | 5/2009 | Chao et al. | |
| 2009/0152583 A1 | 6/2009 | Chen et al. | |
| 2009/0261370 A1 | 10/2009 | Jeong | |
| 2010/0295076 A1 | 11/2010 | Wirth et al. | |

FOREIGN PATENT DOCUMENTS

| | | |
|---|---|---|
| CN | 101897044 | 11/2010 |
| DE | 10-2007-059-621 A1 | 4/2009 |
| JP | 2005-268809 | 9/2005 |
| KR | 20080027584 A | 3/2008 |
| KR | 20080041888 A | 5/2008 |
| WO | WO 2009/039804 A2 | 4/2009 |

OTHER PUBLICATIONS

Jung et al. "Theoretical analysis of polarization characteristics of InGaN/GaN LEDS with photonic crystals", Numerical Simulation of Optoelectronic Devices, 2009. NUSOD 2009. 9$^{th}$ International Conference O,N IEEE, pp. 25-26, Sep. 14, 2009, XP031551971.
References cited in office action of the Chinese Patent office in application No. 201010621719.9, dated Dec. 24, 2012.

* cited by examiner

*Primary Examiner* — Quoc Hoang
(74) *Attorney, Agent, or Firm* — McKenna Long & Aldridge LLP

(57) ABSTRACT

A light emitting device includes a first conductive type semiconductor layer, a second conductive type semiconductor layer, and an active layer between the first conductive type semiconductor layer and the second conductive type semiconductor layer; and
a plurality of polarizers, wherein a distance between a polarizer and an adjacent polarizer along a first direction is different from the polarizer and an adjacent polarizer in a second direction.

21 Claims, 11 Drawing Sheets ial or by combining individual LEDs that emit three primary
LIGHT EMITTING DEVICE, METHOD OF MANUFACTURING THE SAME, LIGHT EMITTING DEVICE PACKAGE AND LIGHTING SYSTEM The present application claims priority under 35 U.S.C. §119 of Korean Patent Application No. 10-2010-0014440 filed on Feb. 18, 2010, which is hereby incorporated by reference in its entirety.

BACKGROUND

Embodiments relate to a light emitting device, a method of manufacturing the same, a light emitting device package, and a lighting system.

A light emitting diode (LED) is a semiconductor light emitting device that converts current into light. In recent years, as the luminance of the LED gradually increased, the use of the LED as a light source for a display, a light source for a vehicle, and a light source for a lighting system have increased. An LED emitting white light and having superior efficiency may be implemented by using a fluorescent material or by combining individual LEDs that emit three primary colors.

The luminance of the LED depends on various conditions, such as the structure of an active layer, a light extracting structure capable of effectively extracting light to an outside, semiconductor material used in the LED, a chip size, and a type of a molding member enclosing the LED.

SUMMARY

Embodiments provide a light emitting device having a novel structure, a method of manufacturing the same, a light emitting device package, and a lighting system.

Embodiments also provide a light emitting device capable of emitting more polarized component in a specific direction than in other directions, a method of manufacturing the same, a light emitting device package, and a lighting system.

Embodiments also provide a light emitting device with an enhanced light emitting efficiency, a method of manufacturing the same, a light emitting device package, and a lighting system.

In one embodiment, a light emitting device comprises a light emitting structure including a first conductive type semiconductor layer, a second conductive type semiconductor layer, an active layer between the first conductive type semiconductor layer and the second conductive type semiconductor layer, and a plurality of polarizers, where a distance between a polarizer and an adjacent polarizer along a first direction is different from the polarizer and an adjacent polarizer in a second direction.

In another embodiment, a method of manufacturing a light emitting device comprises forming a second conductive type semiconductor layer, an active layer and a first conductive type semiconductor layer; forming an ohmic layer on the second conductive type semiconductor layer; forming a plurality of polarizers on the ohmic layer such that a distance between a polarizer and an adjacent polarizer along a first direction is different from the polarizer and an adjacent polarizer in a second direction; forming a reflective layer on the plurality of polarizers; forming a second electrode on the reflective layer; and forming a first electrode on the first conductive semiconductor layer.

In a further embodiment, a light emitting device package comprises a package body on which a light emitting device is mounted; and an electrode layer electrically connected to the light emitting device.

In still another embodiment, a lighting system comprises a substrate; and a light emitting module including a light emitting device disposed on the substrate.

DETAILED DESCRIPTION OF THE EMBODIMENTS

In the following description, it will be understood that when a layer (or film) is referred to as being "on" another layer or substrate, it can be directly on the other layer or substrate, or intervening layers may also be present. Further, it will be understood that when a layer is referred to as being "under" another layer, it can be directly under the other layer, and one or more intervening layers may also be present. In addition, it will also be understood that when a layer is referred to as being "between" two layers, it can be the only layer between the two layers, or one or more intervening layers may also be present.

In the figures, the dimensions of layers and regions are exaggerated for clarity of illustration. In addition, the dimension of each part does not reflect an actual size.

Hereinafter, a light emitting device, a method of manufacturing the same, a light emitting device package, and a lighting system according to embodiments will be described with reference to the accompanying drawings.

In the embodiments, there is exemplarily described a vertical type light emitting device that includes a light emitting semiconductor layer including a second conductive type semiconductor layer, an active layer and a first conductive semiconductor layer sequentially stacked, a first electrode on the light emitting semiconductor layer (i.e., on the first conductive type semiconductor layer), and a second electrode under the light emitting semiconductor layer (i.e., under the second conductive semiconductor layer). Herein, the second electrode may be formed under the light emitting semiconductor layer in a single layer.

In the vertical type light emitting device, a reflective layer having a high reflectivity may be formed between the second conductive type semiconductor layer and the second electrode to thus enhance the light efficiency.

Also, since in the vertical type light emitting device having the reflective layer, a distance between the active layer and the semiconductor layer is very close, the distance between the active layer and the reflective layer is shorter than a wavelength of light emitted from the active layer. Therefore, by changing the distance between the active layer and the reflective layer, a quantum interference effect may be generated to change optical characteristics of the light emitting device. For example, as the distance between the active layer and the reflective layer is changed, the damping rate of a dipole source in the light emitted from the light emitting device is changed.

Figure 1:
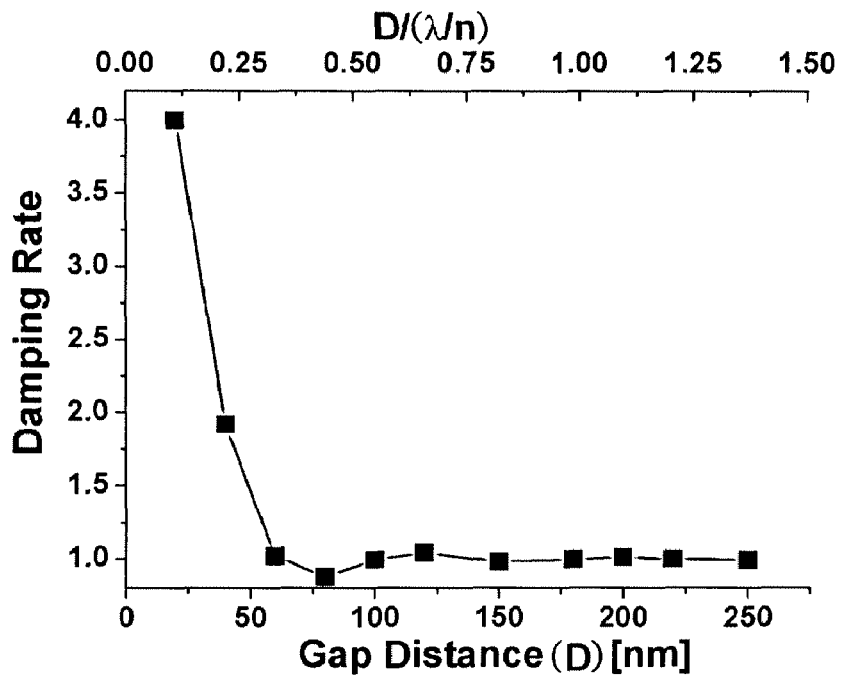
FIG. 1 is a graph showing a damping rate varying with gap distance between an active layer and a reflective layer in a dipole source vibrating vertically to the active layer and the reflective layer.
Figure 2:
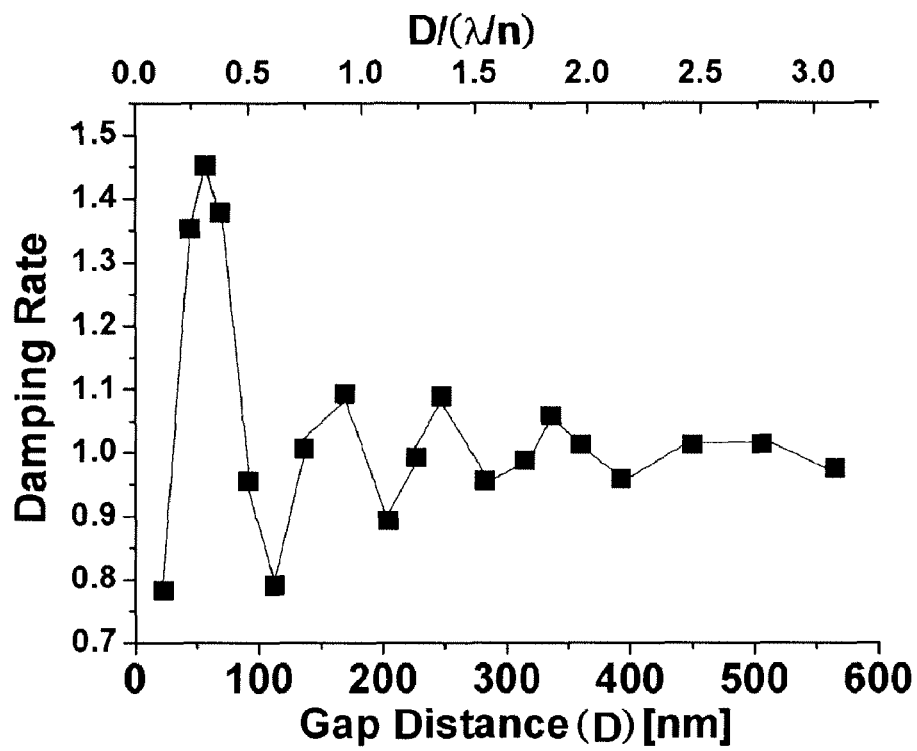
FIG. 2 is a graph showing a damping rate varying with gap distance between an active layer and a reflective layer in a dipole source vibrating horizontally to the active layer and the reflective layer.

FIGS. 1 and 2 are graphs describing a variation in the damping rate according to a vibration direction of a dipole source of light emitted from a light emitting device according to a variation in the distance between an active layer and a reflective layer.

Herein, the damping rate indicates the reciprocal of time taken while electrons of the light emitting device receive energy and emit the received energy in a form of light. In the case where the damping rate is increased, the probability that the dipole source proceeds to a light emitting process is increased, so that the internal quantum efficiency can be enhanced.

Referring to FIGS. 1 and 2, the damping rate of the light emitted from the light emitting device is changed depending on the gap distance D between the active layer and the reflective layer, the refractive index of a material constituting the light emitting device, and the wavelength of the light emitted from the light emitting device.

In FIGS. 1 and 2, a Y-axis indicates the damping rate, an upper X-axis indicates the gap distance D between the active layer and the reflective layer, and a lower X-axis indicates a relative value obtained by dividing the gap distance between the active layer and the reflective layer by $\lambda/n$, where $\lambda$ is a peak wavelength of light emitted from the light emitting device and n is a refractive index of a material constituting the light emitting device.

That is, assuming that the refractive index (n) and the peak wavelength ($\lambda$) are constant, as the gap distance D between the active layer and the reflective layer is changed, the damping rate of the dipole source of the light emitted from the light emitting device according to the vibration direction varies.

The light emitting device exemplified in FIGS. 1 and 2 is a GaN-based light emitting device which emits blue light having the peak wavelength ($\lambda$) of 450 nm and has the refractive index (n) of 2.46. The value of 1.0 on the upper X-axis corresponds to the value of 188.3 nm (=450 nm/2.46) on the lower X-axis.

As shown in FIG. 1, in the case of a dipole source vibrating vertically to an x-y plane, i.e., vertically to the active layer and the reflective layer, as the gap distance D between the active layer and the reflective layer is decreased, the damping rate is increased. As shown in FIG. 2, in the case of a dipole source vibrating horizontally to the x-y plane, i.e., horizontally to the active layer and the reflective layer, the damping rate shows a maximum value at a specific distance (e.g., 50 nm).

Thus, in the vertical type light emitting device, since the gap distance between the active layer and the reflective layer is shorter than the wavelength of the light emitted from the light emitting device, the optical characteristics may be changed with a variation in the gap distance between the active layer and the reflective layer.

It has been described with reference to FIGS. 1 and 2 that the damping rate of the dipole source vibrating vertically to the x-y plane and the damping rate of the dipole source vibrating horizontally to the x-y plane may be changed by changing the gap distance between the active layer and the reflective layer. In the following embodiment to be described, a polarizer is formed between a second conductive semiconductor layer and a reflective layer to change the damping rate of the dipole source vibrating in the x direction and the damping rate of the dipole source vibrating in the y direction, so that light having a superior polarized component in a specific direction is emitted.

Figure 3:
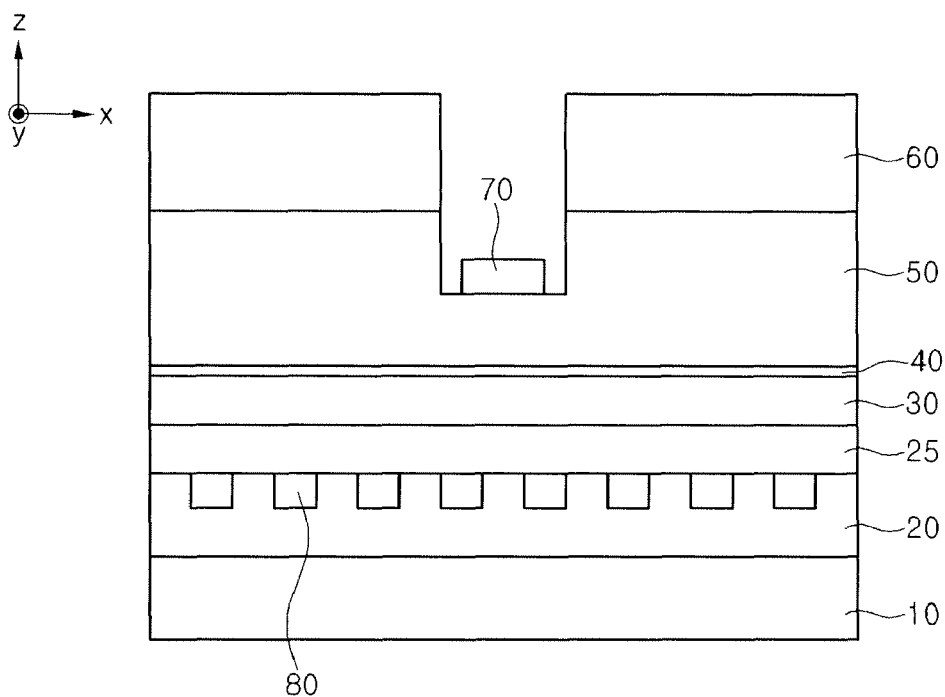
FIG. 3 is a cross-sectional view of a light emitting device according to a first embodiment.

FIG. 3 is a side sectional view of a light emitting device according to a first embodiment.

Referring to FIG. 3, the light emitting device according to the first embodiment includes a second electrode 10, a reflective layer 20 on the second electrode 10, a polarizer such as a polarization inducing pattern 80 on the reflective layer 20, an ohmic layer 25 on the reflective layer and the polarization inducing pattern 80, a second conductive type semiconductor layer 30 on the ohmic layer 25, an active layer 40 on the second conductive type semiconductor layer 30, a first conductive type semiconductor layer 50 on the active layer 40, and a first electrode 70 on the first conductive type semiconductor layer 50. Also, an undoped semiconductor layer 60 may be formed on the first conductive type semiconductor layer 50 and may be spaced apart from the first electrode 70.

In detail, the second electrode 10 may be formed of copper (Cu), titanium (Ti), chromium (Cr), nickel (Ni), aluminum (Al), platinum (Pt), molybdenum (Mo), gold (Au), tungsten (W) or a semiconductor substrate (e.g., Si, Ge, GaAs, ZnO, SiC, SiGe, GaN, etc.) doped with an impurity. The second electrode 10 supplies electric power to the active layer 40 together with the first electrode 70.

The reflective layer 20 may be formed on the second electrode 10. The reflective layer 20 may partially contact the ohmic layer 25, and may be formed of a metal or alloy having a high reflectance. The metal of alloy may includes at least one selected from the group comprising Ag, Al, Pd, and Pt.

A junction metal layer (not shown) may be formed between the second electrode 10 and the reflective layer 20 so as to reinforce an interface junction force between the second electrode 10 and the reflective layer 20. The junction metal layer may include nickel (Ni), titanium (Ti), etc.

The polarization inducing pattern 80 is formed on the reflective layer 20 and under the ohmic layer 25. A side surface of the polarization inducing pattern 80 may be formed such that at least some portion thereof is enclosed by the reflective layer 20.

The polarization inducing pattern 80 may be formed of a nonmetallic material or metallic material having a refractive index which is different from that of the reflective layer 20.

In particular, the polarization inducing pattern 80 may be formed of a nonmetallic material, such as, at least one of oxide, nitride, or fluoride. For example, the polarization inducing pattern 80 may be formed of at least one of indium tin oxide (ITO), indium zinc oxide (IZO), aluminum zinc oxide (AZO), magnesium zinc oxide (MZO), gallium zinc oxide (GZO), $RuO_x$, $IrO_x$, ZnO, $SiO_2$, $MgF_2$, SOG, $TiO_2$, $Al_2O_3$, or $Si_3N_4$.

Also, the polarization inducing pattern 80 may be formed of a metallic material different from that of the reflective layer 20, for example, may be formed of at least one of Ti, Ni, Pt, Ir, or Rh.

Referring to FIG. 3, in the embodiment, the polarization inducing pattern 80 may include a plurality of protrusion patterns, which protrudes toward an inside of the reflective layer 20 in a direction (a negative Z-axis direction in the drawings) vertical to the reflective layer and spaced apart from each other.

Figure 4:
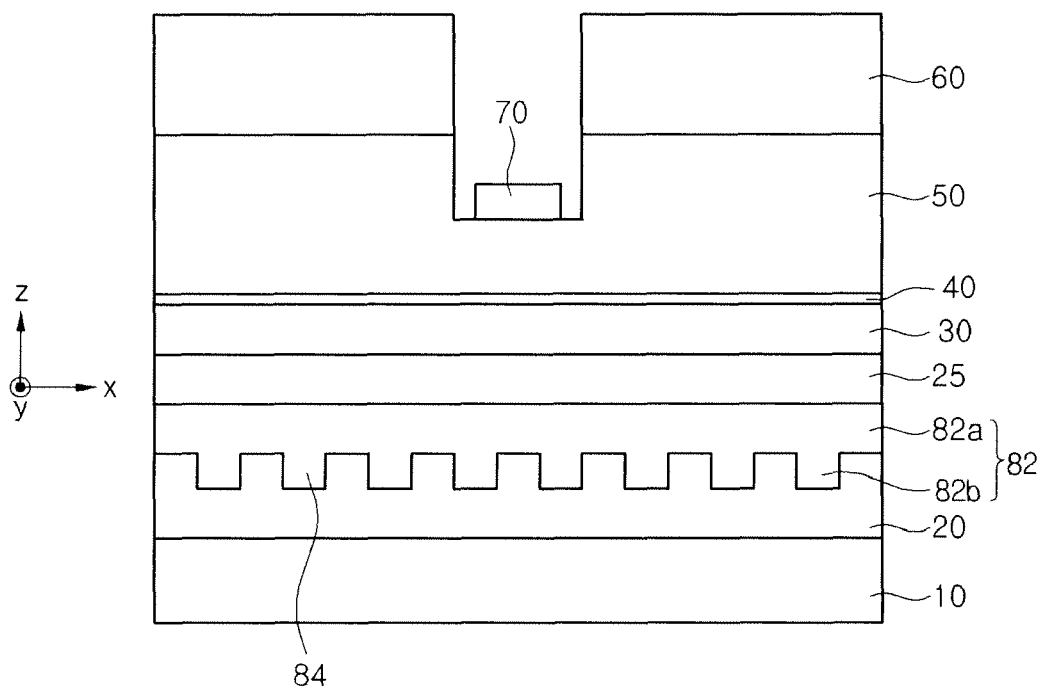
FIG. 4 is a cross-sectional view of a light emitting device according to a modified example of the first embodiment.

However, the invention is not limited thereto. For example, in the case where the polarization inducing pattern 80 is formed of a material having electrical conductivity and current flows through the polarization inducing pattern 80, the polarization inducing pattern 82 may be formed on an entire surface of the reflective layer 20, as shown in FIG. 4. That is, the polarization inducing pattern 80 may include a flat portion 82*a* which is a single body formed on the entire surface of the reflective layer 20 with a plurality of protrusion patterns 82*b* protruded toward the inside of the reflective layer 20 from the flat portion 82*a*.

The polarization of the light emitted from the active layer 40 is controlled by the reflective layer 20 and the polarization inducing pattern 80. That is, the light emitted from the light emitting device has more polarized component in a specific direction than other directions.

That is, in the light emitting device according to the embodiment, since the polarization inducing pattern 80 is disposed at a distance shorter than the wavelength of the light emitted from the light emitting device, the light having superior polarized component in a specific direction may be emitted. In the case of a method of selecting polarized component in a specific direction from light having random polarization, light efficiency may be decreased. However, in the embodiment, since the light itself has superior polarized component in a specific direction, the foregoing light efficiency decrease can be prevented. That is, according to the embodiment, the light having superior polarized component in a specific direction may be emitted with a superior efficiency.

The ohmic layer 25 may be formed on the reflective layer 20. The ohmic layer 25 may be formed on the reflective layer 20 and the polarization inducing pattern 80 as shown in FIG. 3.

The ohmic layer 25 forms an ohmic contact between the second electrode 10 and the second conductive type semiconductor layer 30 so that current may flow smoothly between the second electrode 10 and the second conductive type semiconductor layer 30, thereby enhancing the light emitting efficiency.

The ohmic layer 25 may, for example, include at least one of Ni, Pt, Cr, Ti, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, or $RuO_x$.

Meanwhile, in the case where the ohmic layer 25 is formed of a metallic material, the ohmic layer 25 may be formed at a thickness ranging from 1 nm to 30 nm. In the case where the metallic material is a thin layer, the metallic material may have transparency to thus minimize the light being absorbed by the ohmic layer 25 and being lost. In the case where the ohmic layer 25 is formed of a nonmetallic material having transparency, the ohmic layer 25 may have a thickness ranging from 10 nm to 300 nm.

The second conductive type semiconductor layer 30 may be formed on the ohmic layer 25. The second conductive type semiconductor layer 30 may be, for example, implemented by a p-type semiconductor layer having a compositional formula of $In_xAl_yGa_{1-x-y}N$ ($0 \leq x \leq 1$, $0 \leq y \leq 1$, $0 \leq x+y \leq 1$). The p-type semiconductor layer may be, for example, selected from InAlGaN, GaN, AlGaN, AlInN, InGaN, AlN, InN, or the like, and may be doped with a p-type dopant, such as Mg, Zn, Ca, Sr, Ba, or the like.

The active layer 40 may be formed on the second conductive type semiconductor layer 30. The active layer 40 may be formed including a semiconductor material having a compositional formula of $In_xAl_yGa_{1-x-y}N$ ($0 \leq x \leq 1$, $0 \leq y \leq 1$, $0 \leq x+y \leq 1$), and may be formed in at least one of a single quantum well structure, a multi quantum well (MQW) structure, a quantum dot structure, or a quantum-wire structure.

The active layer 40 may generate light from energy generated while electrons and holes provided from the first conductive type semiconductor layer 50 and the second conductive type semiconductor layer 30 are recombined.

The first conductive type semiconductor layer 50 may be formed on the active layer 40. The first conductive type semiconductor layer 50 may, for example, include an n-type semiconductor layer having a compositional formula of $In_xAl_yGa_{1-x-y}N$ ($0 \leq x \leq 1$, $0 \leq y \leq 1$, $0 \leq x+y \leq 1$). The n-type semiconductor layer may be, for example, selected from InAlGaN, GaN, AlGaN, AlInN, InGaN, AlN, InN, or the like, and may be doped with an n-type dopant, such as Si, Ge, Sn, or the like.

Meanwhile, an n-type or a p-type semiconductor layer may be further formed under the second conductive type semiconductor layer 30. Also, the first conductive type semiconductor layer may be implemented by a p-type semiconductor layer and the second conductive type semiconductor layer may be implemented by an n-type semiconductor layer. Therefore, the light emitting device may include at least one of np junction, pn junction, npn junction, or pnp junction structures, but the present invention is not limited thereto.

The undoped semiconductor layer 60 may be formed on the first conductive type semiconductor layer 50. The undoped semiconductor layer 60 indicates a semiconductor layer having a lower electrical conductivity than the first conductive type semiconductor layer 50 and the second conductive type semiconductor layer 30. For example, the undoped semiconductor layer 60 may be an undoped GaN layer.

The first electrode 70 may be formed in a single layer or multi-layer structure including at least one of Al, Ti, Cr, Ni, Cu, or Au, and may supply power provided from an external power source to the light emitting device.

Figure 5:
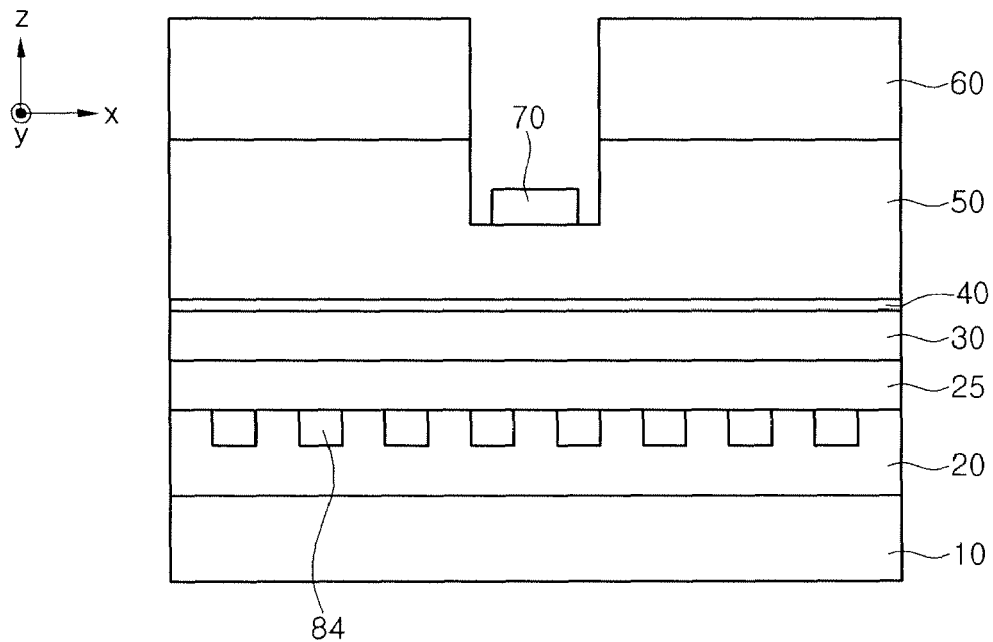
FIG. 5 is a cross-sectional view of a light emitting device according to a second embodiment.

FIG. 5 is a cross-sectional view of a light emitting device according to a second embodiment. In describing the second embodiment, the description overlapping that in the first embodiment will be omitted.

Referring to FIG. 5, the light emitting device according to the second embodiment includes a second electrode 10, a reflective layer 20 on the second electrode 10, an ohmic layer 25 having a protrusion pattern 84 on the reflective layer 20, a second conductive type semiconductor layer 30 on the ohmic layer 25, an active layer 40 on the second conductive type semiconductor layer 30, a first conductive type semiconductor layer 50 on the active layer 40, and a first electrode 70 on the first conductive type semiconductor layer 50. Also, an undoped semiconductor layer 60 may be formed on the first conductive type semiconductor layer 50.

In the light emitting device according to the second embodiment, the protrusion pattern 84 formed integrally with the ohmic layer 25 forms a polarization inducing pattern. That is, in this embodiment, the protrusion pattern 84 is formed integrally with the ohmic layer 25 such that the ohmic layer 25 may function not only as a layer for ohmic contact but also as a polarization inducing pattern.

The protrusion patterns 84 protrude toward the reflective layer 20, and may be spaced apart by a predetermined distance from each other. That is, the protrusion patterns 84 are formed such that lower surfaces and side surfaces thereof protrude toward the inside of the reflective layer 20.

The protrusion pattern 84 may be, for example, formed by forming the ohmic layer 25 and selectively etching the ohmic layer 25, but the invention is not limited thereto.

Figure 6:
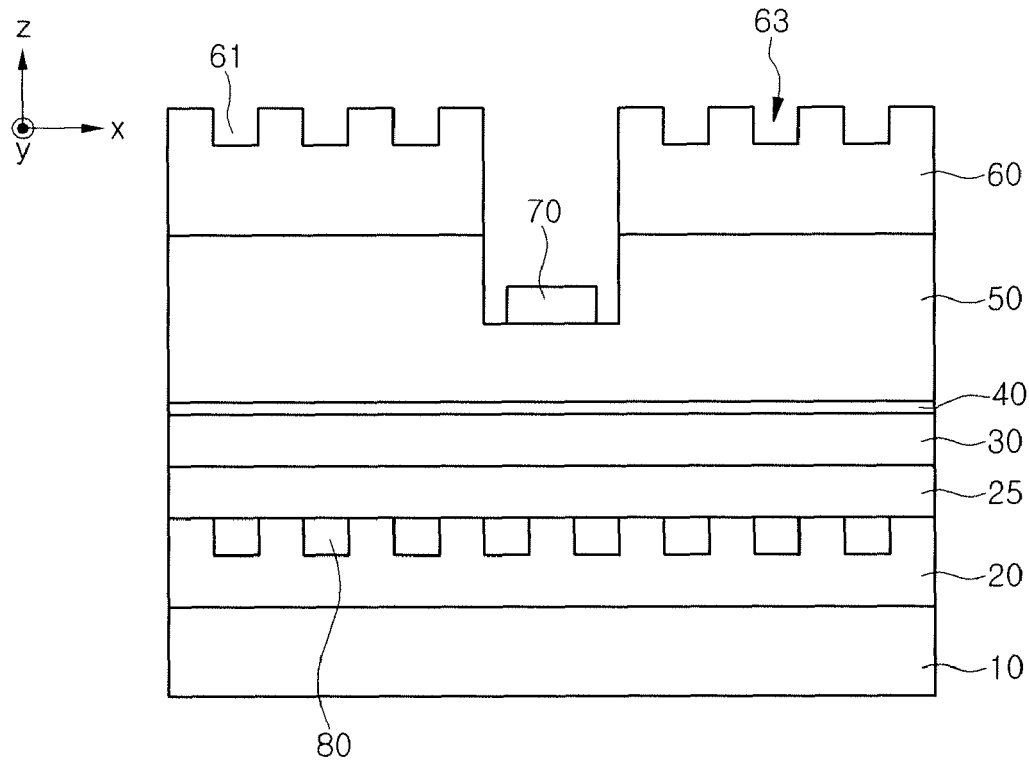
FIG. 6 is a cross-sectional view of a light emitting device according to a third embodiment.

FIG. 6 is a cross-sectional view of a light emitting device according to a third embodiment. In describing the third embodiment, the description overlapping that in the first embodiment will be omitted.

Referring to FIG. 6, the light emitting device according to the third embodiment includes a second electrode 10, a reflective layer 20 on the second electrode 10, a polarization inducing pattern 80 on the reflective layer 20, an ohmic layer 25 on the reflective layer 20 and the polarization inducing pattern 80, a second conductive type semiconductor layer 30 on the ohmic layer 25, an active layer 40 on the second conductive type semiconductor layer 30, a first conductive type semiconductor layer 50 on the active layer 40, a first electrode 70 on the first conductive type semiconductor layer 50, and an undoped semiconductor layer 60 on the first conductive type semiconductor layer 50.

According to one or more embodiments, the undoped semiconductor layer 60 may have a pillar-shaped or hole-shaped photonic crystal structure 63. In the embodiment of FIG. 6, it is exemplified that holes 61 are formed in the undoped semiconductor layer 60.

The pillar or holes 61 are arranged with a period ranging from 50 nm to 3000 nm to selectively transmit or reflect light having a predetermined wavelength band, thereby enhancing light extraction efficiency.

Alternatively, the undoped semiconductor layer 60 may have a random roughness formed by wet etching, but the invention is not limited thereto.

Meanwhile, while FIG. 6 exemplarily shows the light emitting device provided with the polarization inducing pattern 80 of FIG. 3, the photonic crystal structure 63 may be formed at an upper portion of the undoped semiconductor layer 60 of the light emitting device shown in FIGS. 4 and 5.

Alternatively, it is possible to remove the undoped semiconductor layer 60 and the photonic crystal structure 63 on the first conductive type semiconductor layer 50.

Figure 7:
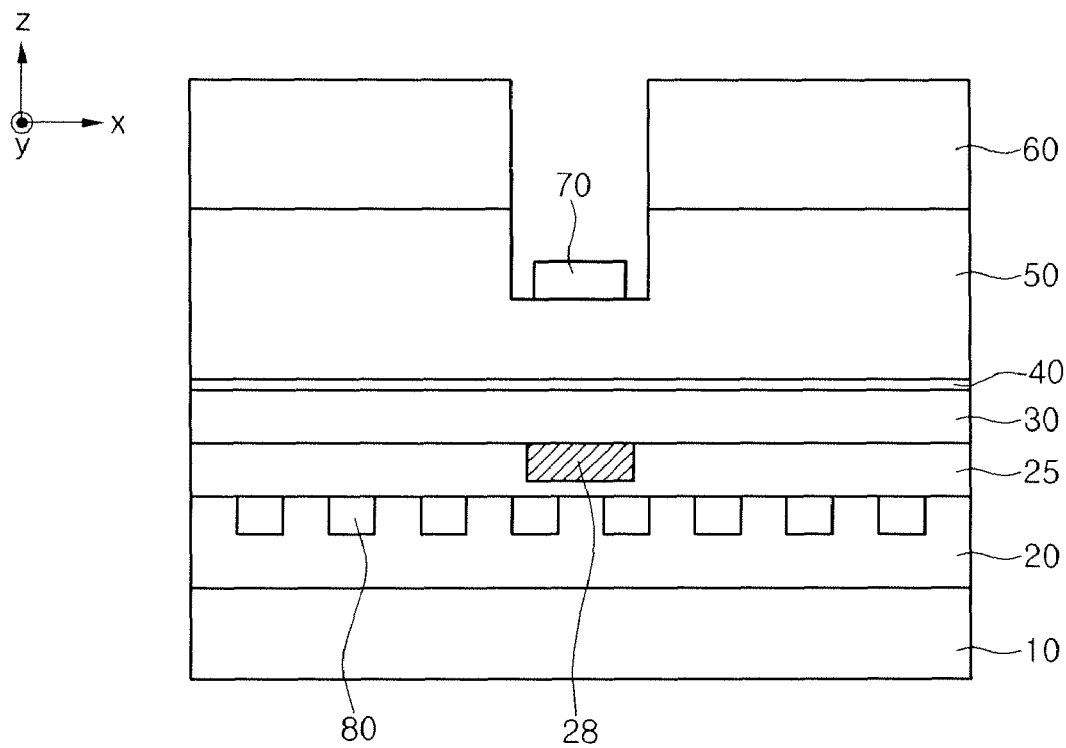
FIG. 7 a cross-sectional view of a light emitting device according to a fourth embodiment.

FIG. 7 is a cross-sectional view of a light emitting device according to a fourth embodiment. In describing the fourth embodiment, the description overlapping that in the first embodiment will be omitted.

Referring to FIG. 7, the light emitting device according to the fourth embodiment includes a second electrode 10, a reflective layer 20 on the second electrode 10, a polarization inducing pattern 80 on the reflective layer 20, an ohmic layer 25 on the reflective layer 20 and the polarization inducing pattern 80, a current blocking layer 28 on the ohmic layer 25, a second conductive type semiconductor layer 30 on the ohmic layer 25 and the current blocking layer 28, an active layer 40 on the second conductive type semiconductor layer 30, a first conductive type semiconductor layer 50 on the active layer 40, a first electrode 70 on the first conductive type semiconductor layer 50, and an undoped semiconductor layer 60 on the first conductive type semiconductor layer 50.

The current blocking layer 28 may be formed between the ohmic layer 25 and the second conductive type semiconductor layer 30 such that the current blocking layer 28 partially overlaps the first electrode 70 in a vertical direction. Therefore, the current blocking layer 28 can prevent current from being concentrated along the shortest path so that the current is distributed into the entire region of the light emitting device, thereby contributing to the enhancement in the light emitting efficiency.

The current blocking layer 28 may be formed of a material forming a Shottkey contact with the second conductive type semiconductor layer 30, a material having an electrical insulation property, or a material having an electrical conductivity lower than the ohmic layer 25. For example, the current blocking layer 28 may include at least one of ZnO, $SiO_2$, $SiO_x$, $SiO_xN_y$, $Si_3N_4$, $Al_2O_3$, $TiO_x$, Ti, Al, or Cr, but the invention is not limited thereto.

Figure 8:
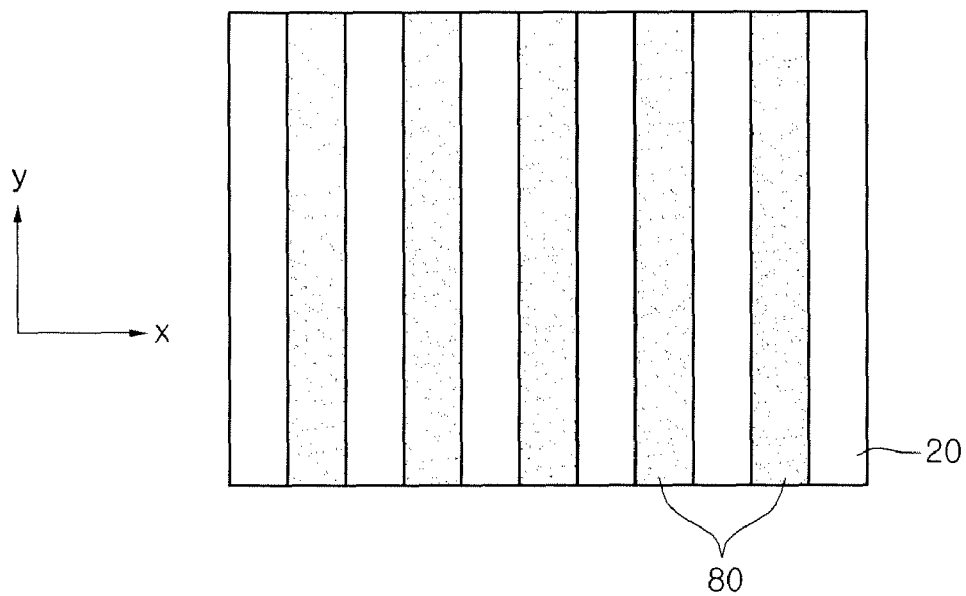
FIGS. 8 to 10 are plan views exemplarily illustrating polarization inducing patterns in light emitting devices according to embodiments.
Figure 9:
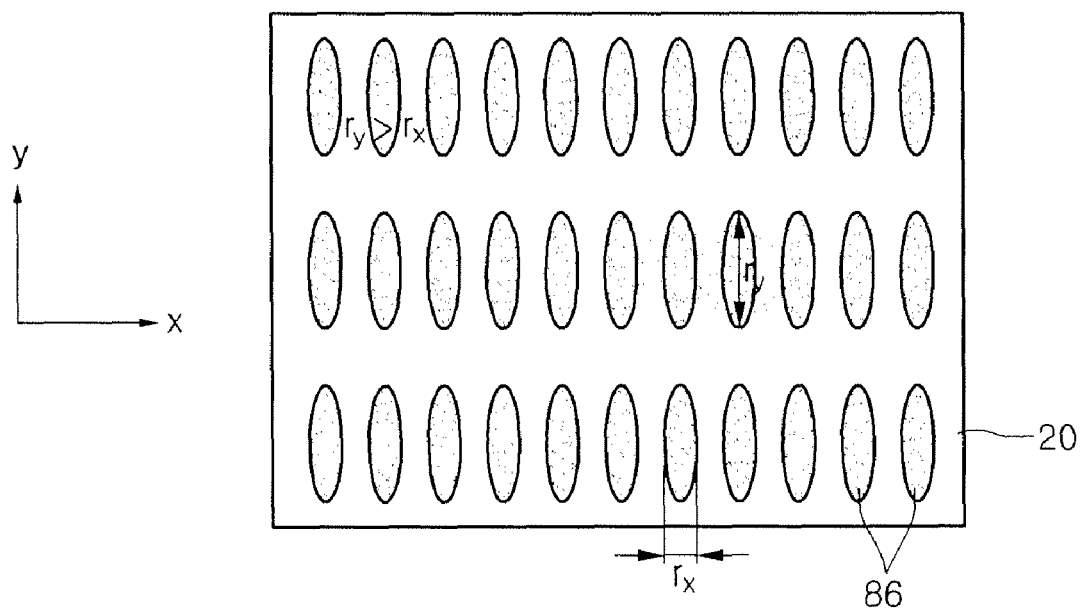
Figure 10:
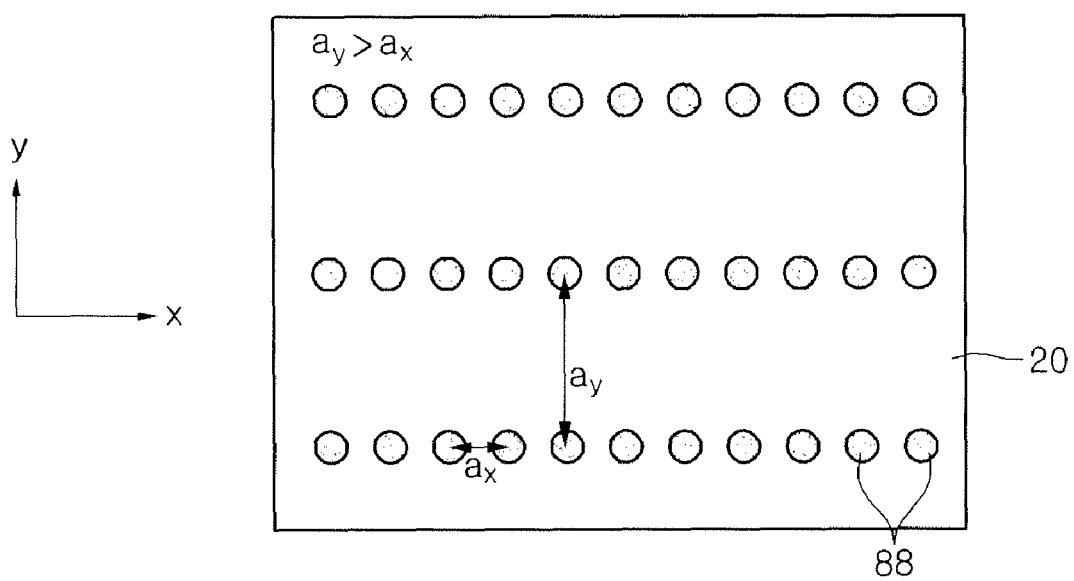

FIGS. 8 to 10 are plan views exemplarily illustrating polarization inducing patterns in light emitting devices according to embodiments.

The polarization inducing patterns 80, 86, 88 shown respectively in FIGS. 8 to 10 are shapes on the x-y plane as viewed from a top side. The polarization inducing patterns 80, 86, 88 shown respectively in FIGS. 8 to 10 are only one example, and the embodiments are not limited thereto.

Also, as described in the first embodiment of FIG. 3, FIGS. 8 to 10 exemplarily show that the polarization inducing patterns 80, 86, 88 spaced apart from one another are formed on the reflective layer 20. However, the protrusion pattern 82a of FIG. 4 or the protrusion pattern 84 of FIG. 5 may have the shapes shown in FIGS. 8 to 10.

Additionally, a case where the polarization inducing pattern 80, 86, 88 is exchanged with the pattern of the reflective layer 20 may be also included in this embodiment.

Referring to FIG. 8, the polarization inducing pattern 80 is formed in a line shape on the reflective layer 20.

The polarization inducing pattern 80 is formed in plurality in a line shape in a first direction, and the plurality of polarization inducing patterns 80 are spaced apart from one another. The polarization inducing patterns 80 extend in the first direction, and are disposed spaced apart from one another in a second direction perpendicular to the first direction.

For example, the polarization inducing pattern 80 has a line shape extending in a y-axis direction, and is formed in plurality. The plurality of polarization inducing patterns are spaced apart from one another in x-axis direction. Therefore, the polarization inducing pattern 80 may have a stripe shape.

Referring to FIG. 9, the polarization inducing pattern 86 of which the length in the x-axis direction is different from the length in the y-axis direction is formed on the reflective layer.

For example, the polarization inducing pattern 86 is formed such that the length $r_y$ in the y-axis direction is greater than the length $r_x$ in the x-axis direction. As shown in FIG. 9, while the polarization inducing pattern 86 may be formed in an elliptical shape of which the length in the y-axis direction is greater than the length in the x-axis direction, the invention is not limited thereto.

Referring to FIG. 10, the polarization inducing patterns 88 are arranged on the reflective layer 20 such that the distance in a first direction is different from the distance in a second direction perpendicular to the first direction.

For example, the polarization inducing pattern 88 is formed in a circular shape, and the distance $a_x$ thereof in the x-axis direction may be less than the distance $a_y$ thereof in the y-axis direction. The polarization inducing pattern 88 may have a polygonal shape, such as a triangle, a rectangle, or the like.

That is, the polarization inducing patterns 80, 86, shown in FIGS. 8 to 10 may be formed with a constant regularity in the first and second directions, and the regularity in the first direction may be different from the regularity in the second direction.

Hereinafter, a method of manufacturing a light emitting device according to the first embodiment will be described in detail.

FIGS. 11 to 16 are cross-sectional views illustrating a method of manufacturing a light emitting device according to the first embodiment.

Figure 11:
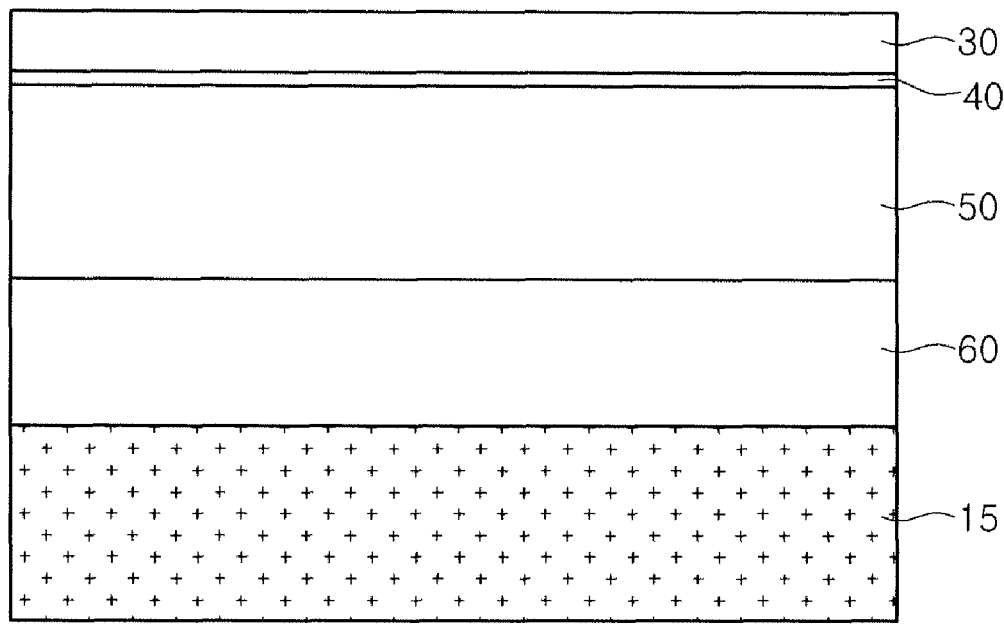
FIGS. 11 to 16 are cross-sectional views illustrating a method of manufacturing a light emitting device according to the first embodiment.

Referring to FIG. 11, an undoped semiconductor layer 60, a first conductive type semiconductor layer 50, an active layer 40 and a second conductive type semiconductor layer 30 may be sequentially grown and formed on a growth substrate 15.

The growth substrate 15 may be formed of at least one of sapphire ($Al_2O_3$), SiC, GaAs, GaN, ZnO, Si, GaP, InP, or Ge, but the invention is not limited thereto.

The growth substrate 15 may be formed by a method such as a metal organic chemical vapor deposition (MOCVD), a chemical vapor deposition (CVD), a plasma-enhanced chemical vapor deposition (PECVD), a molecular beam epitaxy (MBE), a hydride vapor phase epitaxy (HVPE), or the like, but the invention is not limited thereto.

Meanwhile, a buffer layer (not shown) may be further formed between the first conductive type semiconductor layer 50 and the growth substrate 15 so as to buffer a difference in the lattice constant therebetween.

Figure 12:
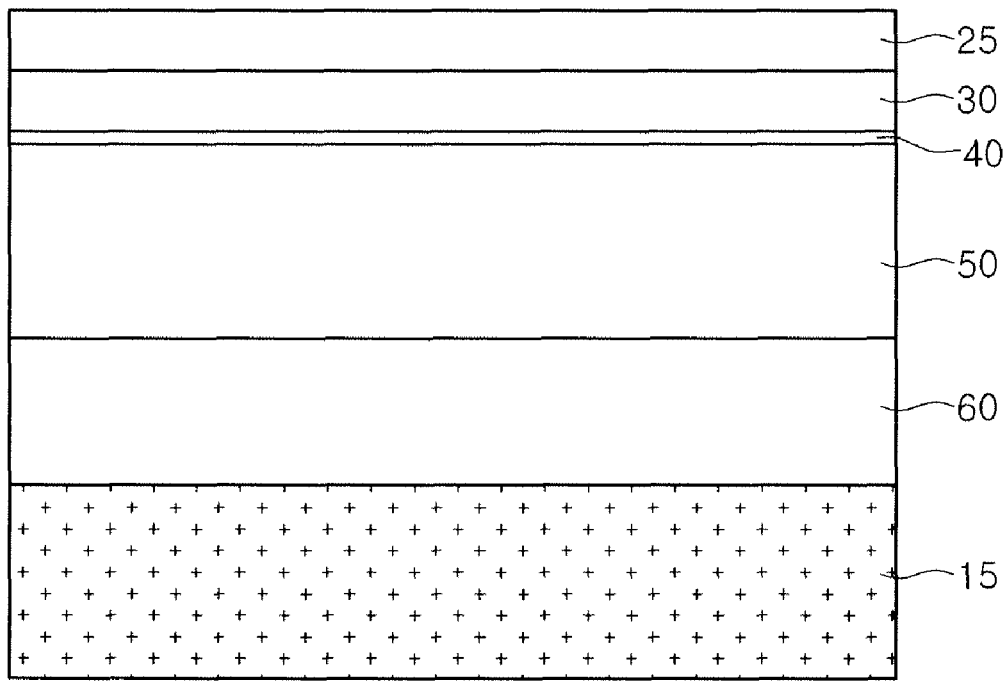

Referring to FIG. 12, an ohmic layer 25 may be formed on the second conductive type semiconductor layer 30.

The ohmic layer 25 may be, for example, formed by a deposition method, such as a plasma enhanced chemical vapor deposition (PECVD), an electron beam deposition, a sputtering, or the like.

Figure 13:
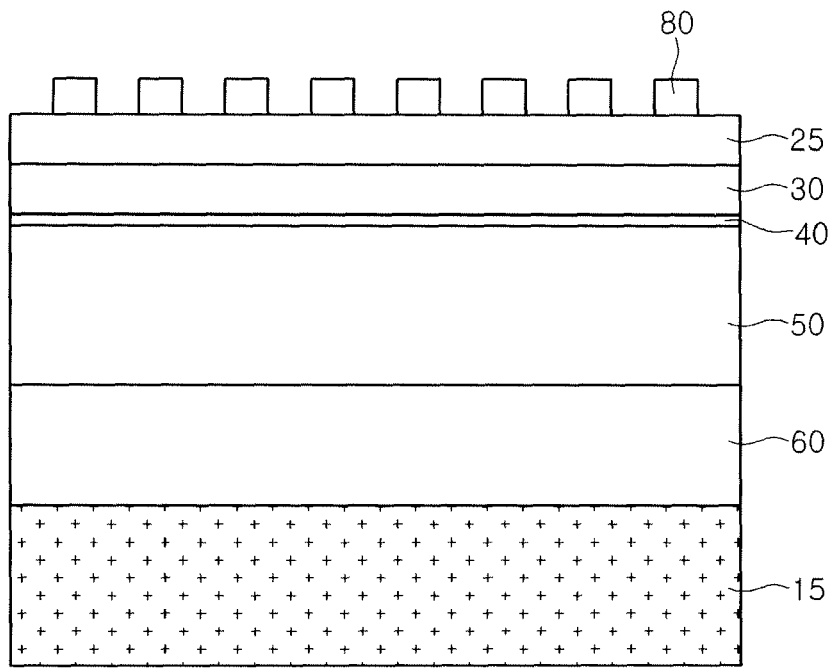

Referring to FIG. 13, a polarization inducing pattern 80 may be formed on the ohmic layer 25.

The polarization inducing pattern 80 may be formed by using a photolithography process or a deposition method.

In the case of forming the polarization inducing pattern 80 using the photolithography process, the polarization inducing pattern 80 may be formed by forming a metallic layer or a nonmetallic layer and selectively removing the metal layer or the nonmetallic layer through an etch process.

Also, in the case of forming the polarization inducing pattern 80 using the deposition method, the polarization inducing pattern 80 may be formed by forming a pattern mask corresponding to the polarization inducing pattern 80, aligning the pattern mask on the ohmic layer 25 and performing deposition.

Also, the polarization inducing pattern 80 may be formed by forming a metallic layer or a nonmetallic layer and patterning the metal layer or nonmetallic layer have a rough surface layer through wet etching.

Figure 14:
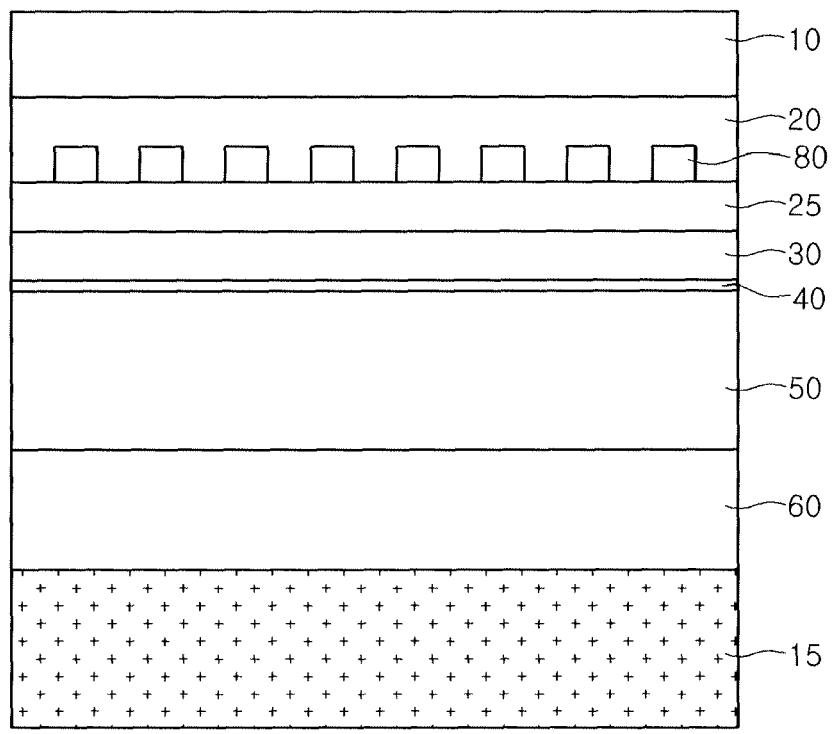

Referring to FIG. 14, a reflective layer 20 may be formed on the ohmic layer 25 and the polarization inducing pattern 80, and a second electrode 10 may be formed on the reflective layer 20.

The reflective layer 20 may be formed by plating or deposition.

The reflective layer 20 may be formed by plating or deposition, but may be formed by preparing the second electrode in a sheet shape and bonding the prepared second electrode on the reflective layer 20.

Meanwhile, a junction metal layer (not shown) may be further formed between the second electrode 10 and the reflective layer 20 so as to enhance an interfacial adhesive force.

Figure 15:
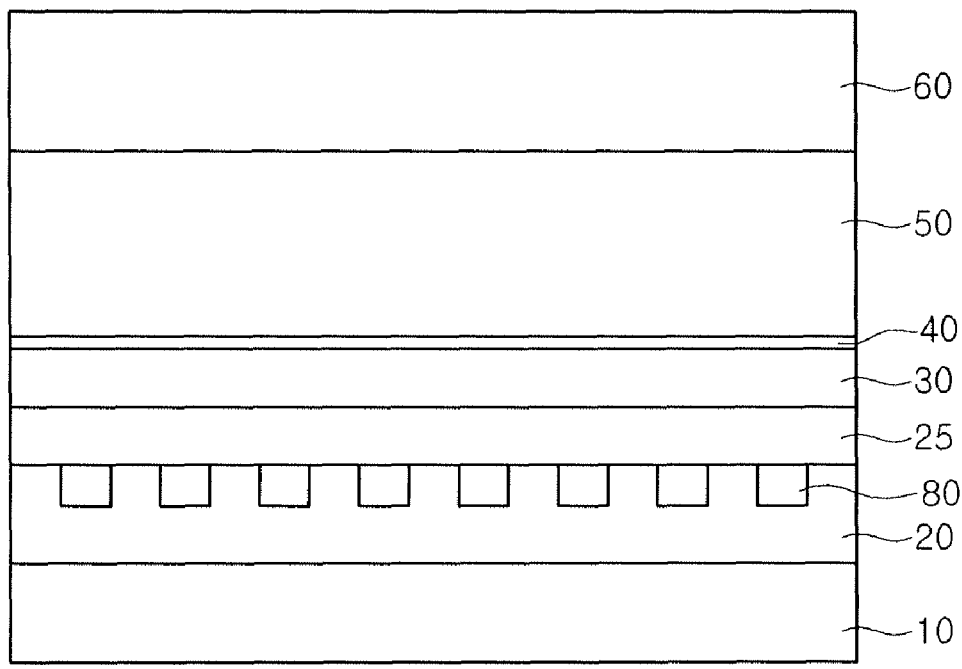

Referring to FIGS. 14 and 15, the growth substrate 15 may be removed.

The growth substrate 15 may be, for example, removed by using a laser lift off process or an etching process.

At this time, since the process of removing the growth substrate 15 and subsequent processes are performed with respect to a lower surface of the light emitting device, the light emitting device of FIG. 14 will be described in an overturned state in FIGS. 15 and 16.

Figure 16:
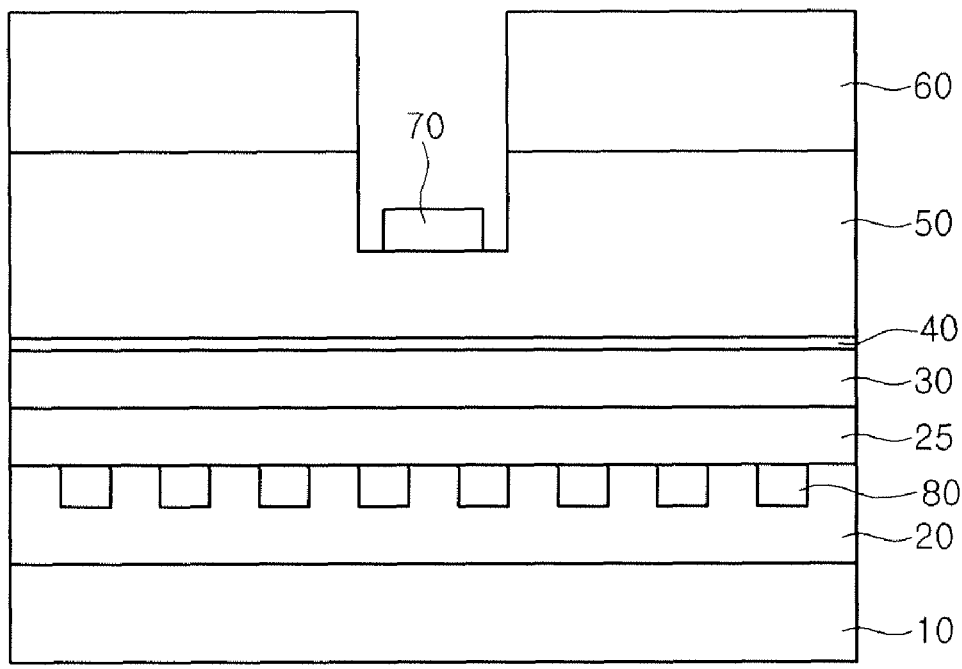

Referring to FIGS. 15 and 16, an etch process is performed such that the upper surface of the first conductive type semiconductor layer 50 is at least partially exposed, and then a first electrode 70 is formed on the exposed first conductive type semiconductor layer 50, so that the light emitting device according to the first embodiment can be provided.

Figure 17:
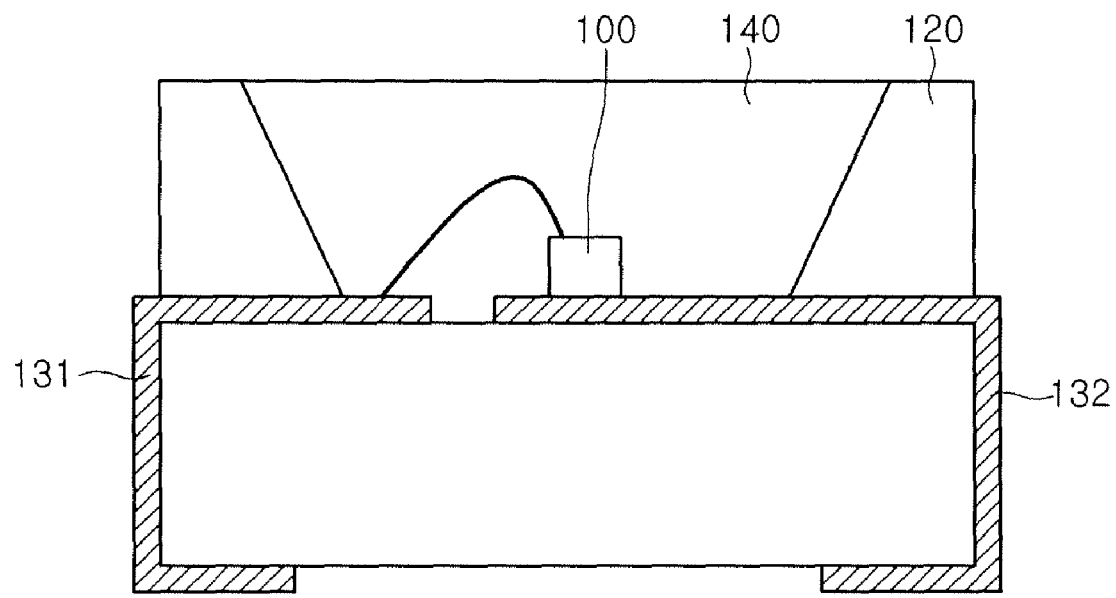
FIG. 17 is a cross-sectional view of a light emitting device package including a light emitting device according to embodiments.

FIG. 17 is a cross-sectional view of a light emitting device package including a light emitting device according to embodiments.

Referring to FIG. 17, the light emitting device package according to the embodiment includes a body 120, first and second electrode layers 131 and 132 mounted on the body 120, a light emitting device 100 according to the embodiments, which is mounted on the body 120 and electrically connected to the first and second electrode layers 131 and 132, and a molding member 140 enclosing the light emitting device 100.

The body 120 may be formed including a silicon material, a synthetic resin material, or a metallic material, and may have an inclined surface around the light emitting device 100.

The first electrode layer 131 and the second electrode layer 132 are electrically separated, and supply electric power to the light emitting device 100. Also, the first and second electrode layers 131 and 132 may reflect light generated from the light emitting device 100 to thus increase light efficiency, and may emit heat generated from the light emitting device 100 to an outside.

The light emitting device 100 may be mounted on the body 120 or on the first electrode layer 131 or the second electrode layer 132.

The light emitting device 100 may be electrically connected to the first electrode layer 131 and the second electrode layer 132 by using any one of a wire bonding method, a flip chip method, or a die bonding method.

The molding member 140 may enclose and protect the light emitting device 100. Also, a fluorescent material may be included in the molding member 140 to change the wavelength of light emitted from the light emitting device 100.

The light emitting device package according to the current embodiment may mount at least one of the light emitting devices according to the foregoing embodiments, but the present invention is not limited thereto. The light emitting device package may include a plurality of light emitting device packages which are arrayed on a substrate. A plurality of optical members, such as a light guide panel, a prism sheet, a diffusion sheet, a fluorescent sheet, and the like may be arranged on a path of light emitted from the light emitting device package. The light emitting device package, substrate and optical members may function as a backlight unit or lighting unit, and a lighting system may include, for example, a backlight unit, a lighting unit, an indicator unit, a lamp, a streetlamp, etc.

Figure 18:
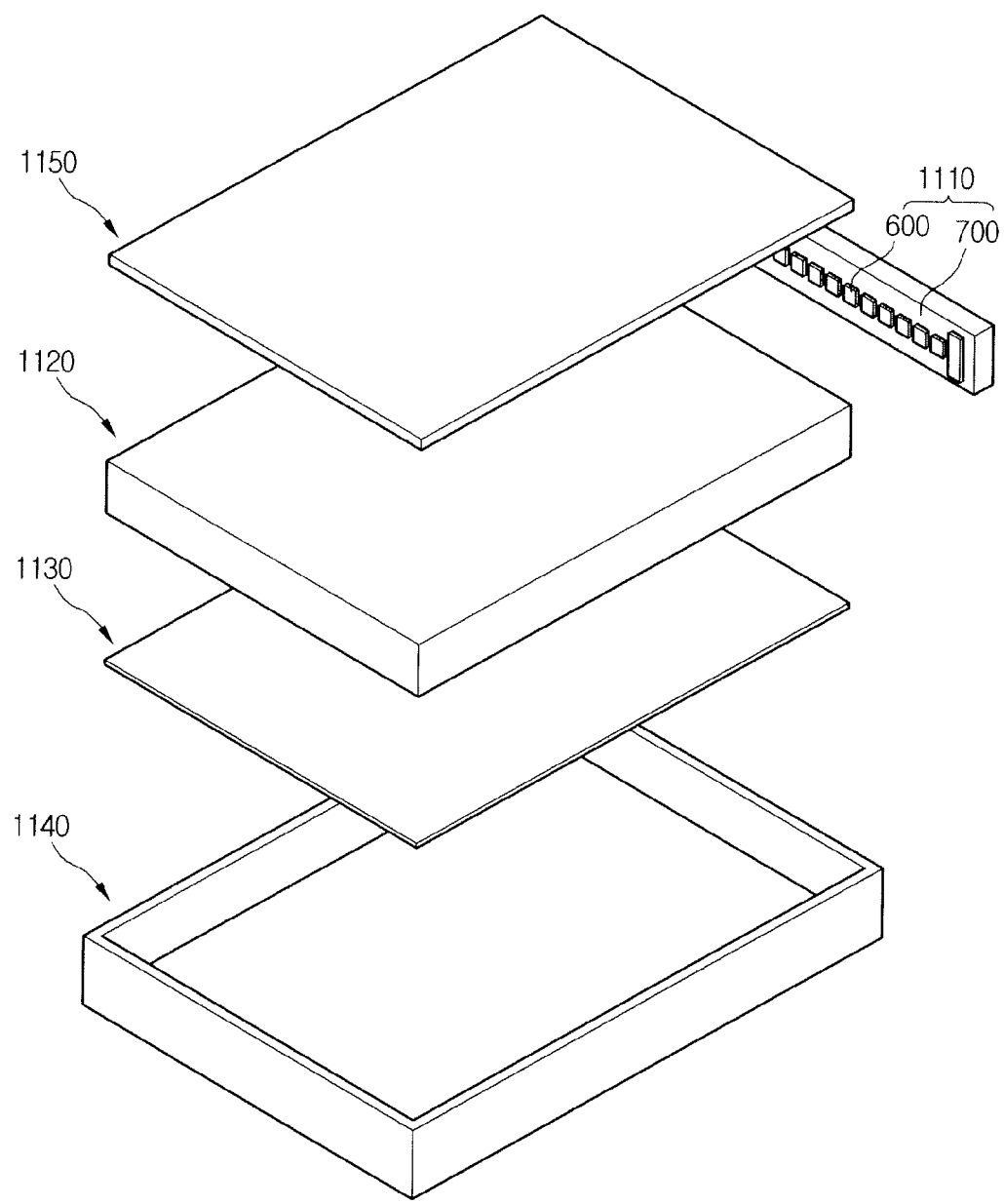
FIG. 18 is a disassembled perspective view of a backlight unit including a light emitting device or a light emitting device package according to an embodiment.

FIG. 18 is a disassembled perspective view of a backlight unit including a light emitting device or a light emitting device package according to an embodiment. The backlight unit 1100 of FIG. 18 is one example of lighting systems, and the present invention is not limited thereto.

Referring to FIG. 18, the backlight unit 1100 may include a bottom cover 1140, a light guide member 1120 disposed in the bottom cover 1140, and a light emitting module 1110 disposed on at least one side surface of the light guide member 1120 or under the light guide member 1120. Also, a reflective sheet 1130 may be disposed under the light guide member 1120.

The bottom cover 1140 may be formed in a box shape a top surface of which is opened such that the light guide member 1120, the light emitting module 1110 and the reflective sheet 1130 can be received. The bottom cover 1140 may be formed of a metal or resin material, but the invention is not limited thereto.

The light emitting module 1110 may include a substrate 700 and a plurality of light emitting device packages 600 mounted on the substrate 700. The plurality of light emitting device packages 600 may provide light to the light guide member 1120. In the light emitting module 1110 according to the current embodiment, it is exemplarily shown that the light emitting device packages 600 are mounted on the substrate 700, but the light emitting devices according to the embodiments may be mounted directly on the substrate 700.

As shown in FIG. 18, the light emitting module 1110 may be disposed on at least one of inner side surfaces of the bottom cover 1140, and thus may provide light to at least one of the side surfaces of the light guide member 1120.

It is also to be understood that the light emitting module 1110 may be disposed under the light guide member 1120 inside the bottom cover 1140 to provide light toward a bottom surface of the light guide member 1120. However, since such a constitution may be modified according to the design of the backlight unit 1100, the invention is not limited thereto.

The light guide member 1120 may be disposed inside the bottom cover 1140. The light guide member 1120 may convert the light provided from the light emitting module to a planar light source and guide the converted plane light source to a display panel (not shown).

The light guide member 1120 may be, for example, a light guide panel (LGP). The LGP may be formed of, for example, one of acryl-series resin such as polymethyl metacrylate (PMMA), polyethylene terephthalate (PET), poly carbonate (PC), COC, and polyethylene naphthalate resin.

An optical sheet 1150 may be disposed on the light guide member 1120.

The optical sheet 1150 may include, for example, at least one of a diffusion sheet, a light-condensing sheet, a brightness enhancement sheet and a fluorescent sheet. For example, the optical sheet 1150 may be configured by the diffusion sheet, the light-condensing sheet, the brightness enhancement sheet and the fluorescent sheet stacked. In this case, the diffusion sheet 1150 diffuses the light emitted from the light emitting module 1110 uniformly, and the diffused light may be condensed on the display panel (not shown) by the light-condensing sheet. At this time, the light emitted from the light-condensing sheet is a randomly polarized light, and the brightness enhancement sheet may increase the polarization of the light emitted from the light-condensing sheet. The light-condensing sheet may be, for example, a horizontal and/or vertical prism sheet. Also, the brightness enhancement sheet may be, for example, a dual brightness enhancement film. Also, the fluorescent sheet may be a transparent plate or film including a fluorescent material.

The reflective sheet 1130 may be disposed under the light guide member 1120. The reflective sheet 1130 may reflect light emitted from the bottom surface of the light guide member 1120 toward a light emitting surface of the light guide member 1120.

The reflective sheet 1130 may be formed of resin material having good reflectivity, for example, PET, PC, PVC resins, or the like, but the invention is not limited thereto.

Figure 19:
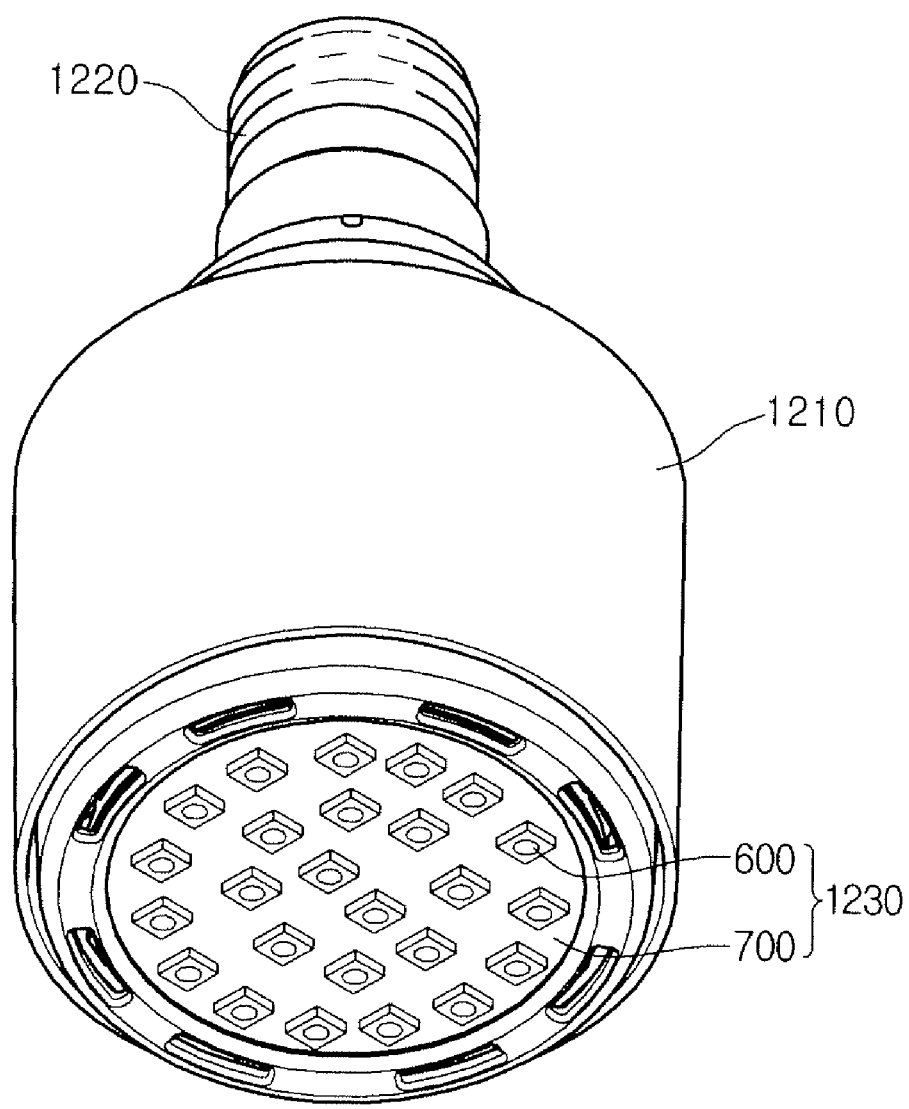
FIG. 19 is a perspective view of a lighting unit including a light emitting device or a light emitting device package according to an embodiment.

FIG. 19 is a perspective view of a lighting unit including the light emitting device or light emitting device package according to the embodiment. The lighting unit 1200 of FIG. 19 is an example of lighting systems and the invention is not limited thereto.

Referring to FIG. 19, the lighting unit 1200 may include a case body 1210, a light emitting module 1230 installed in the case body 1210, and a connection terminal installed in the case body 1210 to be supplied with electric power from an external power source.

The case body 1210 may be preferably formed of a material having good heat shielding characteristic, for example, a metal material or a resin material.

The light emitting module 1230 may include a substrate 700, and a light emitting device package 600 mounted on the substrate 700. In the light emitting module 1230 according to the current embodiment, it is exemplarily shown that the light emitting device packages 600 are mounted on the substrate 700, but the light emitting devices according to the embodiments may be mounted directly on the substrate 700.

The substrate 700 may be an insulator substrate on which a circuit pattern is printed, and may include, for example, a general printed circuit board (PCB), a metal core PCB, a flexible PCB, a ceramic PCB, etc.

Also, the substrate 700 may be formed of a material to efficiently reflect light, and a surface thereof may be formed in a color capable of efficiently reflecting light, for example, white color, silver color, or the like.

At least one light emitting device package may be mounted on the substrate 700. Each of the light emitting device packages 200 may include at least one light emitting diode (LED). The light emitting diode may include a color LED emitting red, green, blue or white light, and a UV LED emitting ultraviolet (UV).

The light emitting module 1230 may have a combination of several LEDs so as to obtain desired color and luminance. For example, the light emitting module 1230 may have a combination of a white LED, a red LED, and a green LED so as to obtain a high color rendering index (CRI). A fluorescent sheet may be further disposed on a path of light emitted from the light emitting module 1230. The fluorescent sheet converts the wavelength of the light emitted from the light emitting module. For example, when the light emitted from the light emitting module 1230 has a blue wavelength band, the fluorescent sheet may include a yellow fluorescent material, so that the light, which is emitted from the light emitting module 1230 and passes through the fluorescent sheet, finally appears as white light.

The connection terminal 1220 may be electrically connected to the light emitting module 1230 to supply an electric power to the light emitting module 1230. As shown in FIG. 19, the connection terminal 1220 may be screwed and coupled to an external power, but the invention is not limited thereto. For example, the connection terminal 1220 may be made in a pin type and inserted into an external power, or may be connected to the external power through a power line.

As described above, the lighting system may include at least one of a light guide member, a diffusion sheet, a light-condensing sheet, a brightness enhancement sheet and a fluorescent sheet on a traveling path of light to obtain a desired optical effect.

As described above, since the lighting system according to this embodiment includes the light emitting device or light emitting device package capable of emitting light having a superior polarized component in a specific direction at a superior efficiency, the lighting system can show superior characteristics. Also, while several embodiments were described with reference to the reflective layer, the polarization inducing pattern may be on any suitable layer near the active layer where a distance between the active layer and the suitable layer is shorter than a wavelength of light emitted from the active layer.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a light emitting structure including a first conductive type semiconductor layer, a second conductive type semiconductor layer, and an active layer between the first conductive type semiconductor layer and the second conductive type semiconductor layer; and
    a plurality of polarizers, wherein a distance between a polarizer and an adjacent polarizer along a first direction is different from the polarizer and an adjacent polarizer in a second direction.

2. The light emitting device of claim 1, further comprising a reflective layer under the second conductive type semiconductor layer and the plurality of polarizers are disposed on the reflective layer.

3. The light emitting device of claim 2, wherein the plurality of polarizers protrude inside of the reflective layer.

4. The light emitting device of claim 2, further comprising an ohmic layer disposed on the reflective layer and forming an ohmic contact with the second conductive type semiconductor layer.

5. The light emitting device of claim 4, wherein the plurality of polarizers are disposed integrally with the ohmic layer.

6. The light emitting device of claim 4, wherein the ohmic layer comprises at least one selected from the group of Ni, Pt, Cr, Ti, ITO, IZO, IZTO, IAZO, IGZO, IGTO, AZO, ATO, GZO, $IrO_x$, and $RuO_x$.

7. The light emitting device of claim 4, wherein the ohmic layer is formed of a metallic material and has a thickness ranging from 1 nm to 30 nm.

8. The light emitting device of claim 4, wherein the ohmic layer is formed of a nonmetallic material and has a thickness ranging from 10 nm to 300 nm.

9. The light emitting device of claim 2, wherein the reflective layer comprises a metal or alloy including at least one selected from the group of Ag, Al, Pd, and Pt.

10. The light emitting device of claim 1, wherein each of the polarizer is circular or substantially circular.

11. The light emitting device of claim 1, wherein each of the polarizer has a first length in a first direction, and a second length in a second direction, wherein the first length is different from the second length.

12. The light emitting device of claim 1, further comprising a current blocking layer between the reflective layer and the second conductive type semiconductor layer.

13. The light emitting device of claim 1, further comprising an undoped semiconductor layer on the first conductive type semiconductor layer, wherein a photonic crystal structure is formed at the undoped semiconductor layer.

14. The light emitting device of claim 1, wherein the plurality of polarizers have a refractive index which is different from that of the reflective layer.

15. The light emitting device of claim 1, wherein the plurality of polarizers are formed of any one of oxide, nitride, or fluoride.

16. The light emitting device of claim 15, wherein the plurality of polarizers comprise at least one selected from the group of ITO, IZO, AZO, MZO, GZO, $RuO_x$, $IrO_x$, ZnO, $SiO_2$, $MgF_2$, SOG, $TiO_2$, $Al_2O_3$, and $Si_3N_4$.

17. The light emitting device of claim 1, wherein the plurality of polarizers are formed of a metallic material which is different from the reflective layer.

18. The light emitting device of claim 17, wherein the plurality of polarizers comprise at least one selected from the group of Ti, Ni, Pt, Ir, and Rh.

19. A light emitting device package comprising:
    a package body on which the light emitting device of claim 1 is mounted; and
    an electrode layer electrically connected to the light emitting device.

20. A lighting system comprising:
    a substrate; and
    a light emitting module including the light emitting device of claim 1 disposed on the substrate.

21. A method of manufacturing a light emitting device, comprising:
    forming a second conductive type semiconductor layer, an active layer and a first conductive type semiconductor layer;
    forming an ohmic layer on the second conductive type semiconductor layer;
    forming a plurality of polarizers on the ohmic layer such that a distance between a polarizer and an adjacent polarizer along a first direction is different from the polarizer and an adjacent polarizer in a second direction;
    forming a reflective layer on the plurality of polarizers;
    forming a second electrode on the reflective layer; and
    forming a first electrode on the first conductive semiconductor layer.

* * * * *